United States Patent
Perng et al.

(10) Patent No.: US 7,122,484 B2
(45) Date of Patent: Oct. 17, 2006

(54) PROCESS FOR REMOVING ORGANIC MATERIALS DURING FORMATION OF A METAL INTERCONNECT

(75) Inventors: Baw-Ching Perng, Hsin-Chu (TW); Yi-Chen Huang, Hsin-Chu (TW); Jun-Lung Huang, Hsin Chu (TW); Bor-Wen Chan, Hsin Chu (TW); Peng-Fu Hsu, Hsinchu (TW); Hsin-Ching Shih, Hsin-Chu (TW); Lawrance Hsu, Hsin-Chu (TW); Hun-Jan Tao, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 120 days.

(21) Appl. No.: 10/833,558

(22) Filed: Apr. 28, 2004

(65) Prior Publication Data

US 2005/0245082 A1 Nov. 3, 2005

(51) Int. Cl.
*H01L 21/469* (2006.01)
*H01L 21/44* (2006.01)

(52) U.S. Cl. ............... 438/765; 438/754; 438/745; 438/134; 438/687; 438/789; 438/790; 438/778; 257/E21.492

(58) Field of Classification Search ......... 438/689, 438/754, 745, 134, 687, 765, 789–790, 778
See application file for complete search history.

(56) References Cited

U.S. PATENT DOCUMENTS

| | | | |
|---|---|---|---|
| 5,273,108 A | 12/1993 | Piper | |
| 5,478,436 A | 12/1995 | Winebarger et al. | |
| 5,677,113 A | 10/1997 | Suzuki et al. | |
| 5,904,560 A | 5/1999 | Brumley | |
| 5,911,837 A | 6/1999 | Matthews | |
| 6,242,165 B1 | 6/2001 | Vaartstra | |
| 6,273,108 B1 | 8/2001 | Bergman et al. | |
| 6,319,809 B1 | 11/2001 | Chang et al. | |
| 6,350,689 B1 * | 2/2002 | Ho et al. | 438/687 |
| 6,423,146 B1 | 7/2002 | Fukazawa | |
| 6,465,356 B1 | 10/2002 | Kim et al. | |
| 6,497,768 B1 | 12/2002 | Bergman | |
| 6,551,409 B1 | 4/2003 | DeGendt et al. | |
| 6,666,986 B1 * | 12/2003 | Vaartstra | 252/79.1 |
| 6,794,307 B1 * | 9/2004 | Chen et al. | 438/754 |
| 6,835,667 B1 * | 12/2004 | Christenson et al. | 438/745 |
| 2004/0103922 A1 * | 6/2004 | Inoue et al. | 134/26 |
| 2004/0150012 A1 * | 8/2004 | Jin et al. | 257/255 |

* cited by examiner

*Primary Examiner*—Michael Lebentritt
*Assistant Examiner*—Mohsen Ahmadi
(74) *Attorney, Agent, or Firm*—Haynes and Boone, LLP

(57) ABSTRACT

A method for removing organic material from an opening in a low k dielectric layer and above a metal layer on a substrate is disclosed. An ozone water solution comprised of one or more additives such as hydroxylamine or an ammonium salt is applied as a spray or by immersion. A chelating agent may be added to protect the metal layer from oxidation. A diketone may be added to the ozone water solution or applied in a gas or liquid phase in a subsequent step to remove any metal oxide that forms during the ozone treatment. A supercritical fluid mixture that includes $CO_2$ and ozone can be used to remove organic residues that are not easily stripped by one of the aforementioned liquid solutions. The removal method prevents changes in the dielectric constant and refractive index of the low k dielectric layer and cleanly removes residues which improve device performance.

31 Claims, 4 Drawing Sheets

PROCESS FOR REMOVING ORGANIC MATERIALS DURING FORMATION OF A METAL INTERCONNECT

FIELD OF THE INVENTION

The invention relates to the field of fabricating integrated circuits and other electronic devices and in particular to a method of removing organic material from a substrate without damaging an underlying low k dielectric layer or an adjacent copper layer.

BACKGROUND OF THE INVENTION

Metal interconnects in a semiconductor device are typically formed by depositing a metal in an opening such as a via or trench in a dielectric layer on a substrate. As the width of interconnects has decreased in order to keep pace with a demand for higher performing devices, conventional $SiO_2$ dielectric layers with a dielectric constant (k value) of about 4 are being replaced by materials with a k value of less than 3.5 and preferably less than 3. The lower k value in a dielectric layer helps to prevent crosstalk between metal wiring and reduces Rc delay, especially for technologies beyond the 130 nm node. Further reduction in k value can be accomplished by increasing the pore size or number of air pockets within a dielectric layer. However, porous dielectric layers are more susceptible to damage during a plasma ashing process such as one required to strip an adjacent photoresist layer during a rework step.

Frequently, a metal interconnect is formed above a conductive layer to provide an electrical pathway to another conductive layer within a stack of conductive layers. Copper is a preferred metal due to a lower resistivity than aluminum. However, copper may also be damaged by plasma ashing during a photoresist rework step. Other ashing steps such as those to remove an inert photoresist plug in a via during a dual damascene process or to strip a photoresist after pattern transfer through a dielectric layer can also damage an exposed copper surface. Therefore, a photoresist removal process that does not involve a plasma etch or ashing step is desirable to minimize damage to an underlying low k dielectric layer and to an exposed copper layer.

An improved photoresist removal process should also be able to strip a photoresist layer or an organic polymer layer that has been hardened by heating or by exposure to ultraviolet (UV) radiation. For example, an inert plug may be formed in a via in a dual damascene process to improve the process latitude of a subsequent photoresist patterning step that forms a trench above the via. However, the plug which is comprised of a hardened organic layer is difficult to remove by non-plasma methods because of its crosslinked character. Likewise, an anti-reflective coating (ARC) is often formed on a substrate just prior to coating a photoresist layer to improve the process latitude of the patterning step. An ARC also prevents trace amounts of contaminants in the underlying dielectric layer from interfering with a chemical reaction in exposed areas of the photoresist. When the ARC is a crosslinked organic polymer, the ARC is difficult to remove other than by a plasma ashing.

The process of reworking a photoresist may occur before or after a patterning step for various reasons including an incorrect exposure which produces an opening that has a width that is outside a specified limit. The stripping process may be required to remove an ARC at the same time. In any case, whether or not an ARC is used, the rework process has a tendency to alter the properties of a low k dielectric layer directly underneath an organic layer. For example, the dielectric constant of the low k dielectric layer may increase or the refractive index (real and imaginary components) can be changed so that the ARC refractive index is no longer matched to that of the dielectric layer. As a result, reflectivity off the low k dielectric layer is increased during a subsequent photoresist patterning step and process latitude is decreased. Therefore, a photoresist removal method should have a minimal effect on the properties of an underlying low k dielectric layer.

Ozone has been used to remove organic materials in an asher. In U.S. Pat. No. 5,677,113, a strip method involving ozone and UV radiation is described. U.S. Pat. No. 6,465,356 describes a strip method with ozone, heat, and UV exposure.

A method for stripping organic layers on a substrate with ozone and $H_2O$ in a gas phase is provided in U.S. Pat. No. 6,551,409. A rinse fluid consisting of 5% $H_2SO_4$ in $H_2O_2$ may also be applied.

In U.S. Pat. No. 5,911,837, an organic layer is stripped from a substrate in a tank of DI water by diffusing ozone into the solution and then rinsing with DI water at a higher temperature. A thin layer of organic solvent is then added on the water layer and acts as a drying solvent as the wafer is slowly pulled out of the water through the low vapor pressure solvent which is octane, decane, or a ketone.

The prior art includes stripping methods with an ozone treatment in a liquid phase. The use of ozone, $NH_4OH$, and water is mentioned in U.S. Pat. No. 6,423,146. A method with ozone and HF is provided in U.S. Pat. No. 6,497,768. Optionally, photoresist and an ARC can be removed by a liquid spray comprised of ozone, $NH_4OH$, and water. An apparatus for performing the aforementioned spray process is provided in U.S. Pat. No. 6,273,108.

Yet another method of removing an organic layer with ozone is mentioned in U.S. Pat. No. 6,242,165 where supercritical $CO_2$ is employed as a carrier solvent for ozone. However, no reaction conditions are given that teach or suggest a way of using the $CO_2/O_3$ combination effectively since $SO_3$ is described as the preferred oxidizer.

SUMMARY OF THE INVENTION

One objective of the present invention is to provide a method for removing an organic layer from a substrate that does not involve a plasma or ashing process.

A further objective of the present invention is to provide a method of removing a photoresist or inert plug layer in a dual damascene scheme that does not damage an adjacent low k dielectric layer or an underlying copper layer.

A still further objective of the present invention is to provide a supercritical fluid (SCF) process that has improved cleaning efficiency for removing organic residues from a trench and/or via.

Yet another objective is to provide a cost effective SCF process for removing organic residues from an opening with an exposed copper layer during the process of fabricating a copper interconnect.

These objectives are achieved in one embodiment by providing a substrate that contains a patterned copper layer. An etch stop layer is deposited on the copper layer and adjacent substrate regions and a low k dielectric layer is formed on the etch stop layer. A conventional patterning and etching sequence is used to fabricate an opening in a first photoresist layer where the opening extends through the etch stop layer and stops on the copper surface. A key feature is that the photoresist is stripped by a solution comprised of ozone water and one or more chemical additives. The solution may be applied in either a single wafer mode or in a batch process. In one aspect, the chemical additives include one or more of $NH_4OH$, $NH_4F$, and other ammonium halides. In another aspect, the chemical additives include one or more of HF, $H_2SO_4$, and HCl. The cleaning process may be enhanced further by adding a chelating agent such as a di-acetic acid. The substrate is rinsed with DI water and is dried.

A plug layer is formed in the via by applying an organic layer on the low k dielectric layer and applying the ozone water cleaning solution with one or more additives so that the organic layer is removed above the low k dielectric layer and forms a slight recess in the via. The organic layer is hardened by heating or by exposure with UV radiation and heating to form an inert plug comprised of a crosslinked polymer network. A second photoresist layer is applied and patterned to form a trench opening above the via. The trench opening is transferred into the low k dielectric layer by a plasma etch. The remaining plug layer and second photoresist are simultaneously removed by applying the same cleaning solution as described for stripping the first photoresist layer. Optionally, a second cleaning step is used to treat the substrate when the ozone containing solution reacts with the copper layer to produce a thin copper oxide cap. The second cleaning step involves the application of hexafluoroacetylacetone in either a liquid or gas phase. After rinsing and drying the substrate, the dual damascene process may be completed by depositing a diffusion barrier layer in the via and trench openings, depositing a second copper layer, and planarizing the second copper layer to be coplanar with the low k dielectric layer.

In a second embodiment, a plug in a via opening within a low k dielectric layer is generated as described in the first embodiment except that the etch stop layer remains in place between the plug layer and the first copper layer. A trench pattern is formed in a second photoresist layer above the via and is transferred into the low k dielectric layer with an etch process. The plug, second photoresist layer, and etch stop layer at the bottom of the via are removed by an ashing process that leaves organic residues within the trench and via. The organic residues are removed in a chamber in which supercritical $CO_2$ and an oxidizer which is ozone are applied. Optionally, a second cleaning step involving the liquid or gas phase application of a compound with a diketone functionality such as hexafluoroacetylacetone is performed to remove any copper oxide formed on the first copper layer during the $CO_2/O_3$ treatment. The interconnect is completed by depositing a diffusion barrier layer and a second copper layer and planarizing as described previously.

DETAILED DESCRIPTION OF THE INVENTION

Figure 1:
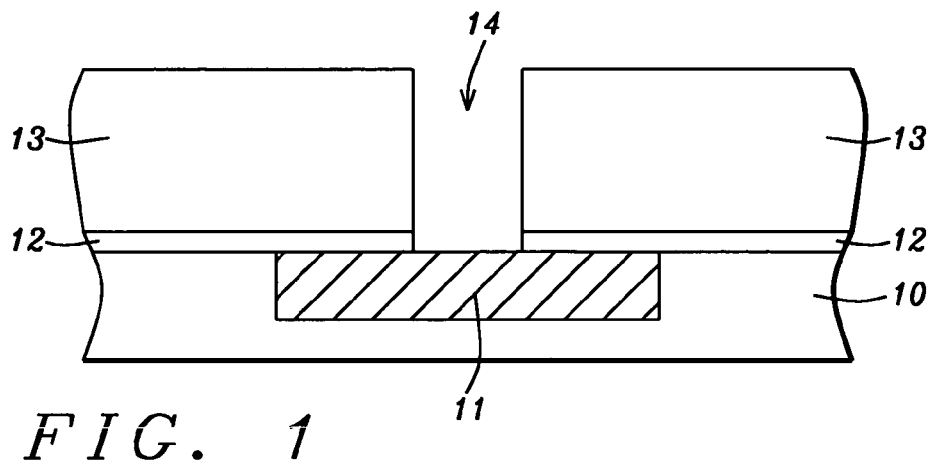
FIGS. 1–6 are cross-sectional views depicting a sequence of steps for forming a copper interconnect including a cleaning method of the present invention.

The present invention is a particularly useful method for removing organic residues and organic layers from a substrate, especially during the fabrication of a copper interconnect. Although a via first dual damascene method is depicted in the drawings, the method also applies to other manufacturing schemes where an organic layer is removed from a substrate. The largest benefit is achieved when the organic layer or organic residue is adjacent to a low k dielectric layer or a copper layer.

In the first embodiment which is illustrated in FIGS. 1–6, a method is provided for simultaneously removing a photoresist layer from the surface of a low k dielectric layer and an inert organic plug from inside an opening above a copper layer. It should be understood that the terms removal and cleaning are used interchangeably in describing the method of this invention.

Referring to FIG. 1, a substrate 10 is provided that is typically silicon but may be based on silicon-on-insulator, silicon-germanium, or other semiconductor materials used in the art. A first copper layer 11 is formed in the substrate 10 by a conventional method and has a top surface that is coplanar with the substrate 10. Additionally, there may be a diffusion barrier layer (not shown) on the sides and bottom of the first copper layer 11 that separates the copper from the substrate 10. The substrate 10 may contain active and passive devices as well as dielectric layers and other conductive layers that are not shown in order to simplify the drawing. An etch stop layer 12 is deposited on the first copper layer 11 and on the substrate 10 by a chemical vapor deposition (CVD) or plasma enhanced CVD (PECVD) process and is comprised of silicon carbide, silicon oxynitride, or silicon nitride.

A low k dielectric layer 13 having a k value of preferably less than about 3.5 is deposited on the etch stop layer 12 by a spin-on, CVD, or PECVD process. The low k dielectric layer 13 is preferably an oxide based material such as fluorine doped $SiO_2$, carbon doped $SiO_2$, phosphosilicate glass (PSG), borophosphosilicate glass (BPSG), or a silsesquioxane polymer. A via 14 is formed in the low k dielectric layer 13 by a conventional method that typically involves coating a photoresist layer (not shown) on the low k dielectric layer 13, exposing the photoresist layer through a mask, and developing with an aqueous base solution to give a via pattern. Optionally, an anti-reflective coating (ARC) which is not shown is formed on the low k dielectric layer 13 prior to coating the photoresist layer in order to improve the process latitude of the patterning step. The remaining photoresist layer is employed as an etch mask during a plasma etch step that typically includes a fluorocarbon gas to transfer the via 14 through the low k dielectric layer 13. A soft etch known to those skilled in the art is then used to remove the etch stop layer at the bottom of the via 14. A soft etch is preferred in order to minimize damage to the first copper layer 12 and to top corners and sidewalls of the low k dielectric layer 13 in via 14.

At this point, the remaining photoresist layer and any ARC, if present, are stripped by a liquid solution according to a method of the present invention. In one embodiment, the liquid solution is applied in a process chamber of a commercially available tool known to those skilled in the art. The liquid solution may be applied as a spray to one wafer at a time or by an immersion method. With an immersion method, more than one wafer may be cleaned simultaneously in a batch process. The method of the present invention will also remove any organic residues that were generated by one of the preceding plasma etch steps.

The liquid solution is preferably comprised of water, ozone, and a small amount of chemical additives. Ozone is typically produced by a commercial ozone generator as appreciated by those skilled in the art. The ozone water is formed by bubbling ozone through water in a bulk feed tank or directly into water in an immersion tank. The reservoir containing the ozone water is connected to the process chamber with a pipe that has an injection valve such as the one described in U.S. Pat. No. 6,423,146. Additional components may be injected into the ozone water at the injection valve.

In one embodiment hereafter referred to as process A, the additional components (additives) include one or more of $NH_4OH$, hydroxylamine, $NH_4F$, $NH_4Cl$, $NH_4Br$, and $NH_4I$ that are injected as aqueous solutions. The volume of additives injected into the ozone water is preferably less than 5% of the volume of liquid that is fed into the process chamber. The substrate 10 along with the photoresist layer and portions of the low k dielectric layer 13 within the via 14 are treated with the liquid solution comprised of ozone water and one or more of the aforementioned nitrogen containing additives at a temperature from about 5° C. to 100° C.

In an alternative embodiment hereafter referred to as process B, the additives include one or more of $H_2SO_4$, HCl, and HF that are injected as aqueous solutions. The volume of additives injected into the ozone water is preferably less than 5% of the volume of liquid that is fed into the process chamber. The substrate 10, photoresist layer, and portions of the low k dielectric layer 13 are treated with the liquid solution comprised of ozone water and one or more of the aforementioned acids at a temperature from about 5° C. to 100° C.

Optionally, other additives may be injected into the liquid solution described in process A or B. For example, an aqueous solution of a chelating agent may be injected into the liquid solution so that the final weight of chelating agent is less than about 1% of the total weight of the liquid solution that is applied in the process chamber. The chelating agent is preferably a di-acetic acid such as ethylenediamine-N,N'-diacetic acid (EDDA) or ethylenediamine-N,N'-tetraacetic acid (EDTA) which are used in conventional cleaning solutions. The chelating agent is used to protect the exposed first copper layer 11 from oxidation during the ozone treatment.

Once the photoresist layer and etch residues are stripped with the liquid solution, the substrate 10 is rinsed with DI water and dried to complete one cycle. The substrate 10 may be subjected to a second cycle if a visual inspection of the substrate 10 with a scanning electron microscope (SEM), for example, reveals the presence of some photoresist residues, ARC, or etch residues that have not been removed from the low k dielectric layer 13 or from within the via 14.

In some cases where the width of the via in the photoresist layer is inspected before etching and found to be either too large or too small, the photoresist layer must be reworked and is stripped by a process A or process B as described previously. The present invention is preferred over an $O_2$ ashing method that can degrade the low k dielectric layer by altering its refractive index, for example. The rework process is completed by coating and patterning a similar photoresist layer to form a via 14 with the correct width before an etch is performed to transfer the via 14 through the low k dielectric layer 13.

Figure 2:
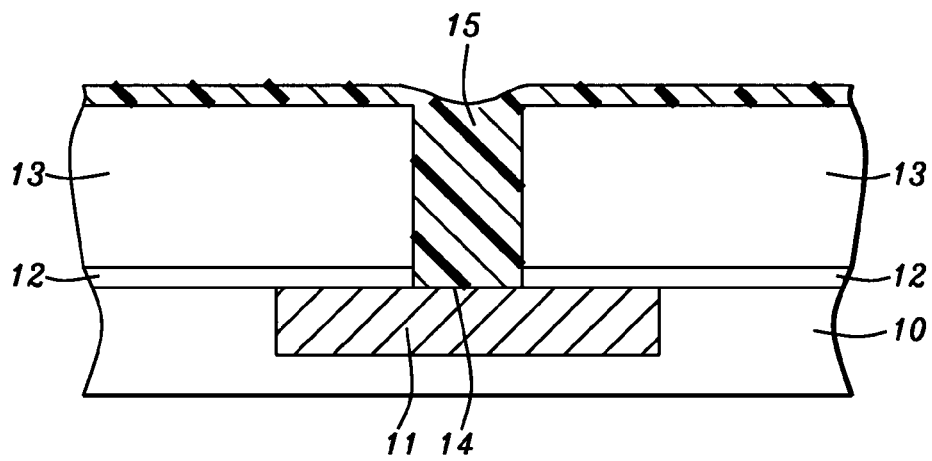
Figure 3:
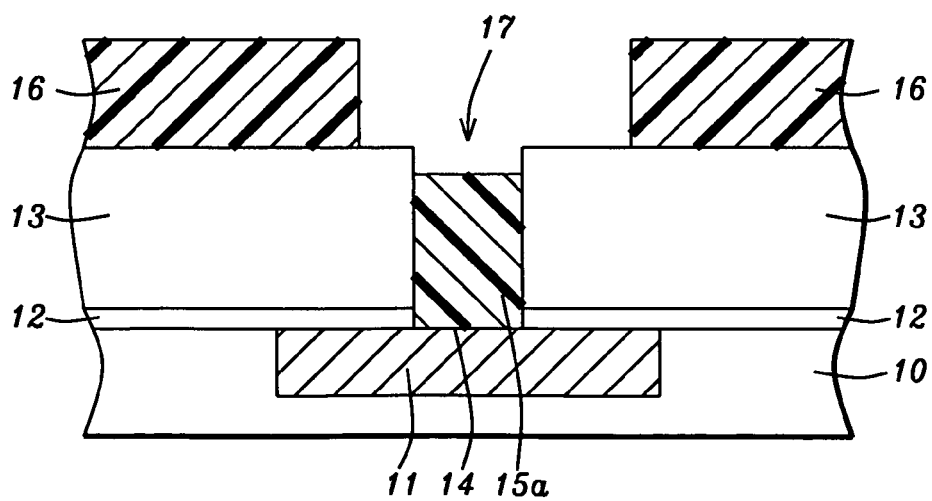

Referring to FIG. 2, an organic layer 15 comprised of a photoresist or a polymer is spin coated on the low k dielectric layer 13 and baked to fill the via 14. In FIG. 3, the organic layer 15 is thinned to a level that is equal to or slightly below the top of the via 14 by applying a liquid solution as previously described in process A or B for a predetermined period of time. It is understood that the thickness of the organic layer 15 may be measured and that processes A and B have known removal rates of an organic layer. This technique avoids the usual method of etching back the organic layer 15 with a plasma etch or ashing that includes $O_2$ which can damage the low k dielectric layer 13. A hard bake at about 200° C. to 250° C. may be performed to ensure that the resulting plug layer 15a will not mix with a subsequently coated photoresist layer.

In an alternative embodiment in which isolated and dense via patterns (not shown) are formed in the same low k dielectric layer 13 as the via 14, a second organic layer (not shown) may be coated on the thinned organic layer 15 and low k dielectric layer 13. Typically, the thinned organic layer 15 does not completely fill the via and the second organic layer fills the via 14 and other vias in the isolated and dense via patterns. The second organic layer is thinned in a manner similar to thinning the organic layer 15 to form a more uniform plug layer 15a in via 14 and in the isolated and dense vias as described in application TS01-1765 which is herein incorporated by reference. A hard bake at about 200° C. to 250° C. may be performed to ensure that the resulting plug layer 15a will not mix with a subsequently coated photoresist layer. The plug layer 15a protects the first copper layer 11 during a subsequent trench patterning step and also prevents trace amounts of contaminants in the low k dielectric layer 13 from interfering with a subsequent photoresist patterning step.

Figure 4:
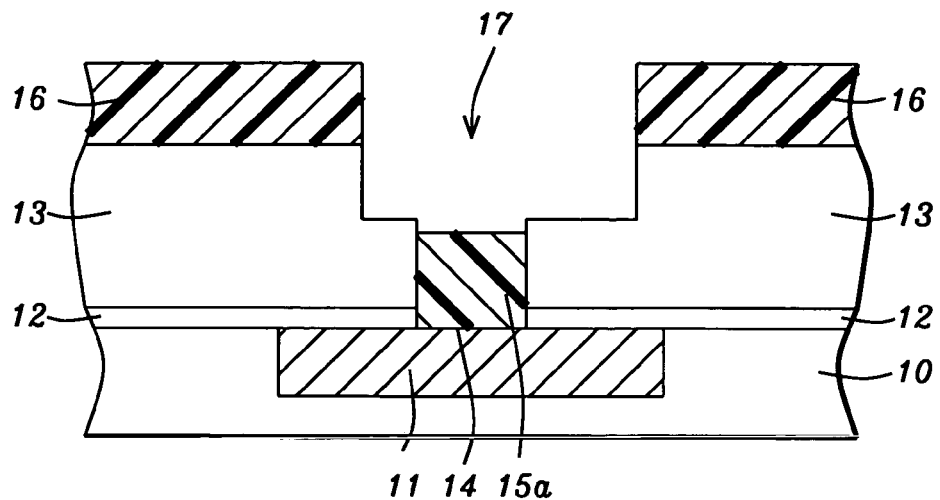

Referring to FIG. 4, a second photoresist layer 16 is coated on the low k dielectric layer 13 and also fills via 14 above the plug layer 15a. Optionally, an ARC layer may be coated on the low k dielectric layer 13 prior to forming the second photoresist layer 16. The second photoresist layer 16 is exposed through a mask and is developed to form a trench pattern in which a trench 17 is formed above the via 14. Other damascene designs are possible besides the one shown in FIG. 4. For example, one trench may be formed above two vias. Note that the second photoresist layer 16 is also removed above the plug layer 15a in the via 14.

The trench 17 is transferred into the low k dielectric layer 13 by a plasma etch process that uses conditions similar to the etch that formed via 14 in the low k dielectric layer 13. The level of the plug layer 15a is lowered by the etch and may be lower than the bottom of the trench 17.

Figure 5:
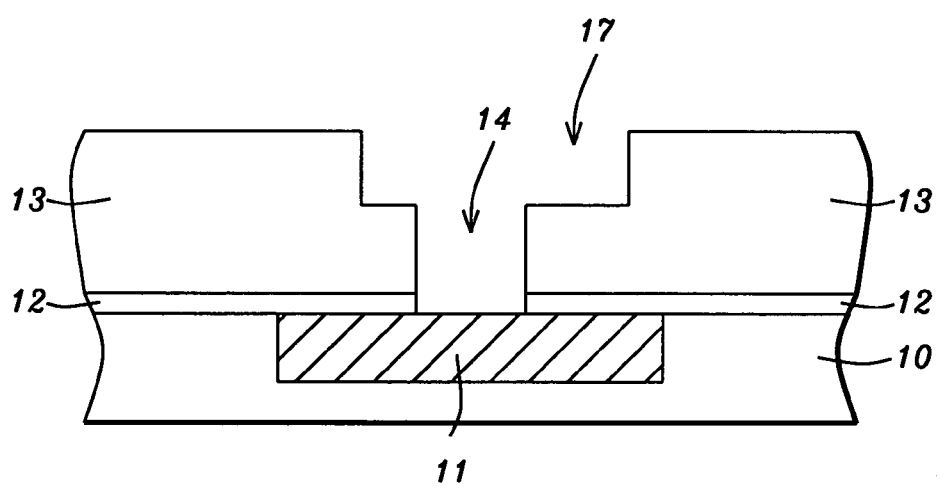

Referring to FIG. 5, a key feature of the present invention is the use of process A or process B described previously to simultaneously remove the second photoresist 16, plug layer 15a, and any etch residues present within via 14 or trench 17. Process A or B is followed by a DI water rinse and drying to complete one cycle. Additionally, a second cycle may be performed to ensure that no organic residues remain. For example, a first cycle involving a process A may be followed by a second cycle involving a process B or vice versa. In an alternative embodiment, the process A or process B in a one or two cycle application may further involve the injection of a chelating agent such as EDDA or EDTA into the liquid solution that is applied in the process chamber.

Figure 6:
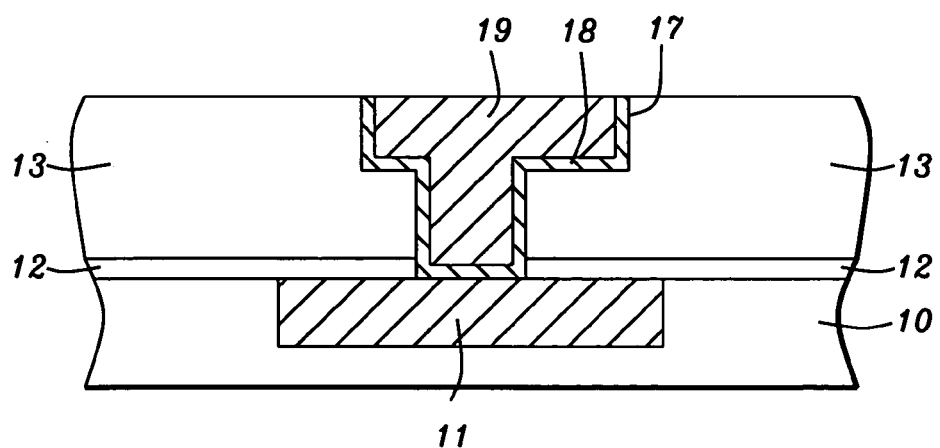

Referring to FIG. 6, the dual damascene fabrication scheme is completed by forming a conformal diffusion barrier layer 18 on the sidewalls and bottoms of the trench 17 and via 14. The diffusion barrier layer 18 is comprised of one or more of Ta, TaN, Ti, and TiN, for example, A second copper layer 19 is deposited on the diffusion barrier layer 18 to a level above the low k dielectric layer 13 and is preferably planarized by a chemical mechanical polish (CMP) process so that the polished second copper layer 19 is coplanar with the low k dielectric layer 13. The resulting copper interconnect 19 has improved performance over a prior art method involving the removal of organic layers and etch residues based on an $O_2$ ashing.

Figure 7:
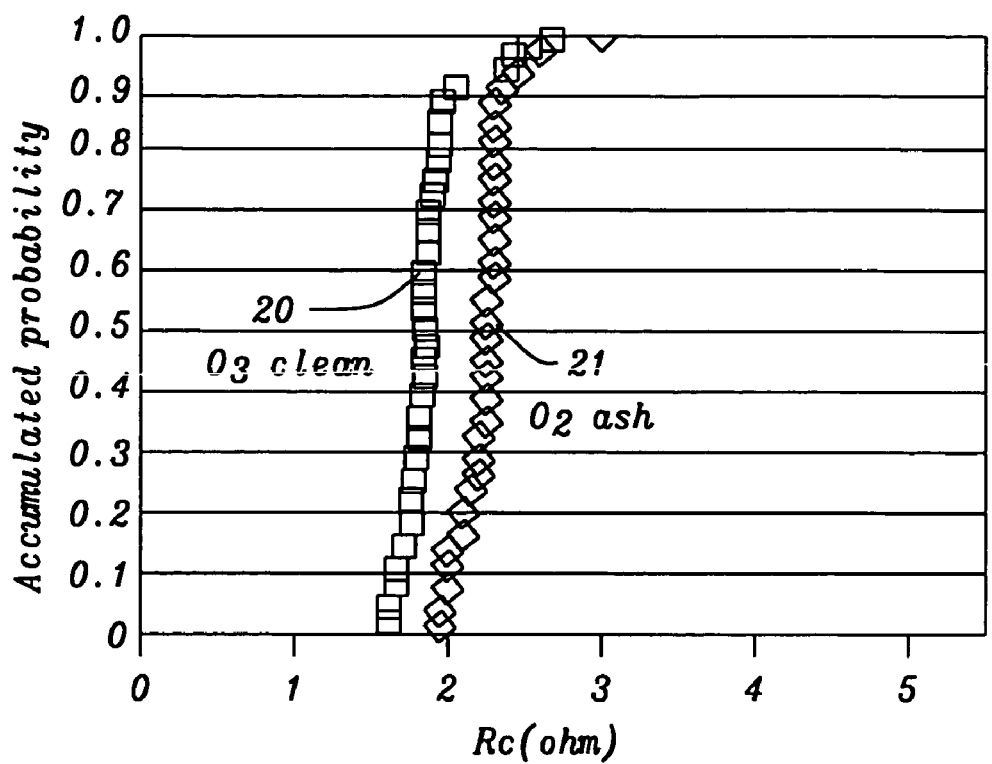
FIG. 7 is a plot showing Rc in ohms on the x-axis and accumulated probability on the y-axis that indicates an improvement in device performance by employing a cleaning method according to the first embodiment of the present invention.

Referring to FIG. 7, a plot of resistance (Rc) in ohms on the x-axis and accumulated probability on the y-axis is shown for a copper interconnect formed by a method of the present invention (line 20) and a prior art method (line 21) that employs an $O_2$ ash for removing a photoresist layer and a plug layer during the interconnect fabrication. One advantage is a lower Rc value for a copper interconnect formed by a method of the present invention. In particular, the inventors have found that implementing the novel cleaning method disclosed herein prevents damage to a low k dielectric layer and to an underlying conductive layer and thereby improves device performance.

In the second embodiment which is illustrated in FIGS. 8–11, a method is provided for cleaning organic residues from an opening in a substrate, and in particular, one that is formed in a low k dielectric layer and above a conductive layer. The method is not restricted to a dual damascene method but may apply to a single damascene method or to other processes that involve removing organic materials from a low k dielectric layer. Therefore, the opening may be a via, a trench, or a trench formed above a via.

Figure 8:
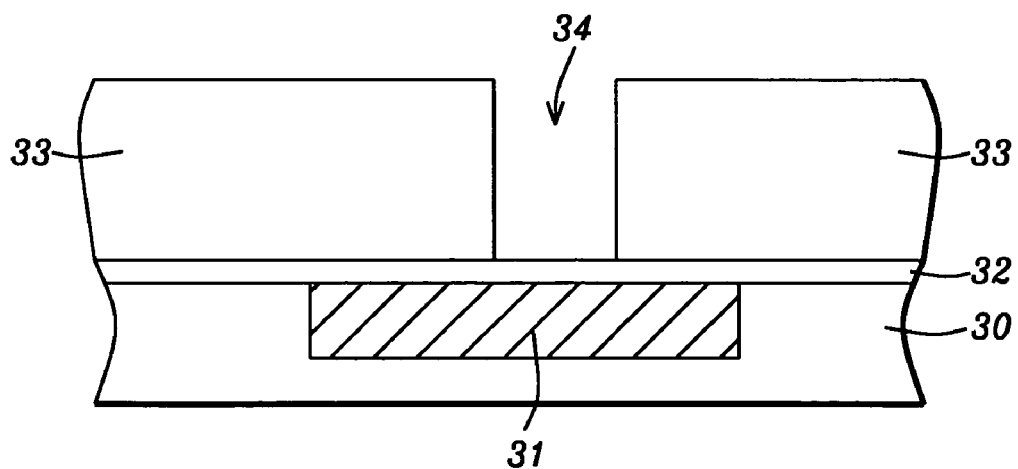
FIGS. 8–11 are cross-sectional views that illustrate a sequence of steps for forming a copper interconnect that includes a cleaning method according to a second embodiment of the present invention.

Referring to FIG. 8, a substrate 30 is provided that is typically silicon but may be based on silicon-on-insulator, silicon-germanium, or other semiconductor materials used in the art. A conductive layer 31 that is preferably copper is formed in the substrate 30 by a conventional method and is coplanar with the top surface of the substrate 30. Additionally, there may be a diffusion barrier layer (not shown) on the sides and bottom of the conductive layer 31. The substrate 30 may be further comprised of active and passive devices as well as dielectric layers and other conductive layers that are not shown. An etch stop layer 32 is deposited on the conductive layer 31 and on the substrate 30 by a CVD or PECVD process and is comprised of silicon carbide, silicon oxynitride, or silicon nitride.

A low k dielectric layer 33 preferably having a k value of less than about 3.5 is deposited on the etch stop layer 32 by a spin-on, CVD, or PECVD process. The low k dielectric layer 33 is preferably comprised of fluorine doped $SiO_2$, carbon doped $SiO_2$, PSG, BPSG, a polysilsesquioxane, or other oxide based materials known to those skilled in the art. A via 34 is formed in a first photoresist layer (not shown) and in a low k dielectric layer 33 by a conventional method as described in the first embodiment. Optionally, an ARC layer (not shown) may be formed on the low k dielectric layer 33 before coating and patterning the first photoresist layer. In one embodiment, the plasma etch process through the low k dielectric layer 33 stops on the etch stop layer 32. The etch stop layer 32 is left in place during the subsequent trench patterning step to help protect the conductive layer 31.

The first photoresist layer and an ARC, if present, are then removed by a commercial liquid stripper, or by a liquid solution of the present invention according to process A or B which were described in the first embodiment. Optionally, a plasma ashing step that includes $O_2$ is used to remove the first photoresist and ARC but is less preferred because of possible damage to the low k dielectric layer 33. In another embodiment, the first photoresist layer is stripped by a liquid solution comprised of ozone and DI water that also includes a chelating agent such as EDDA or EDTA. The liquid strippers are applied in a spray tool that typically is in a single wafer mode or by immersion in a batch process tool.

Figure 9:
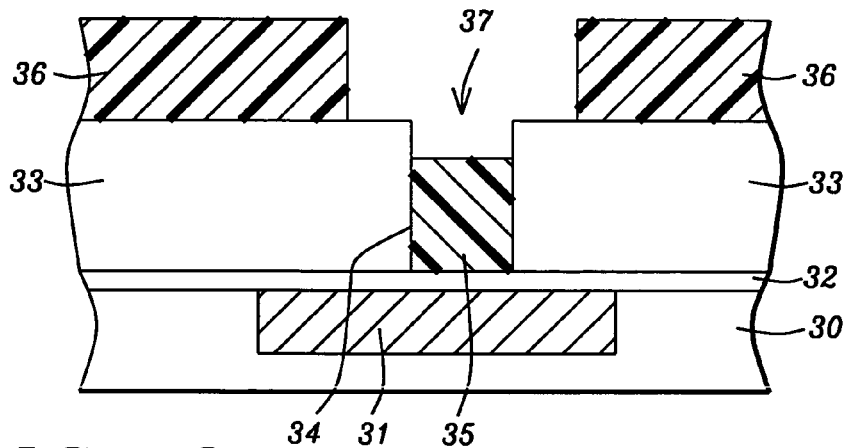

Referring to FIG. 9, a plug layer 35 is formed in the via 34 by a method described in the first embodiment. The plug layer 35 is comprised of a hardened photoresist layer or a polymer layer that has been crosslinked and has a top surface that is recessed below the top of via 34. A second photoresist layer 36 is coated on the low k dielectric layer 33 and fills the via 34 above the plug layer 35. The second photoresist layer 36 is exposed through a mask and is developed to form a trench pattern in which a trench 37 is formed above the via 34. In another embodiment, a trench 37 is formed above two or more vias (not shown). Those skilled in the art will appreciate that the present invention is equally applicable to other dual damascene patterns which are not shown.

Figure 10:
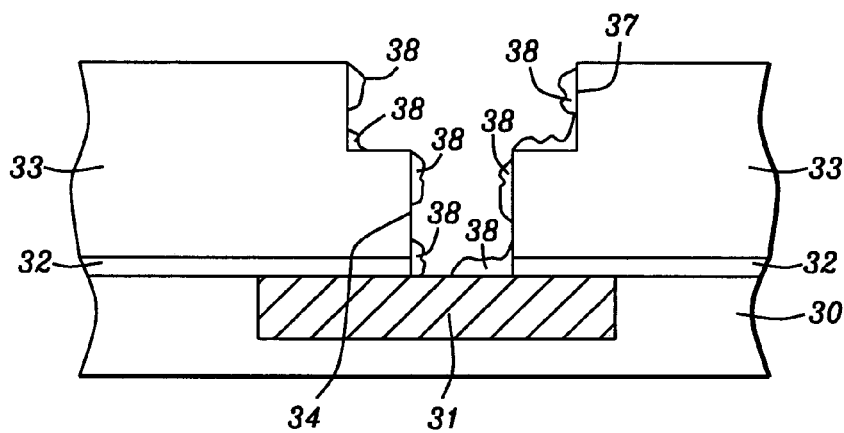

Referring to FIG. 10, the trench 37 is transferred into the low k dielectric layer 33 by a plasma etch process that uses conditions similar to the etch that formed the via 34 in the low k dielectric layer 33 as appreciated by those skilled in the art. The plug layer 35 and second photoresist layer 36 are then removed by a plasma ashing that typically includes oxygen and a fluorocarbon. Some organic residues 38 may remain on the sidewalls and bottom of via 34 and trench 37. The organic residues 38 may contain a fluorocarbon polymer as a result of the fluorocarbon gas in the ashing step. The etch stop layer 32 is typically removed by a soft plasma etch process known to those skilled in the art so as to avoid damage to the conductive layer 31 and to the exposed portions of the low k dielectric layer 33. The organic residues 38 are usually difficult to remove by commercially available cleaning solutions. Several conventional cleaning cycles are often necessary to strip the residues 38 which can add considerable cost to the device fabrication process. Furthermore, conventional cleaning methods may alter the refractive index and dielectric constant of the low k dielectric layer 33 and thereby lower device performance.

The inventors have discovered an improved method that is especially effective in removing organic residues 38 during an interconnect fabrication process such as in a via first dual damascene scheme. The substrate 30 with organic residues 38 is treated with a liquid solution comprised of ozone in DI water. In one embodiment, a process A or process B is followed as in the first embodiment. Process A or B may encompass the addition of a chelating agent such as EDDA or EDTA to the liquid cleaning solution so that the final weight of chelating agent is less than about 1% of the total weight of the liquid solution that is applied in the process chamber. The liquid solution is applied as a spray on a single wafer or by immersing a wafer or a batch of wafers in a process chamber containing the liquid solution with ozone water and additives. The chelating agent is used to protect the exposed conductive layer 31 from oxidation during the ozone treatment. Alternatively, a diketone such as hexafluoroacetylacetone may be added to a solution comprised of ozone in DI water. Once the photoresist layer and organic residues 38 are stripped with the liquid solution, the substrate 30 is rinsed with DI water and dried to complete one cycle.

In another embodiment, the substrate 30 is treated with a solution comprised of ozone in water. The substrate 30 is rinsed and dried and then is treated with a diketone in either a liquid phase or a gas phase. For example, the diketone may be applied as a liquid at the rate of about 0.001 to 10 ml per minute or as a gas at a flow rate of about 1 to 10 sccm in a process chamber as appreciated by those skilled in the art.

The diketone is employed to remove a thin metal oxide layer that can form as a result of exposing the conductive layer 31 to ozone.

The substrate 30 may be subjected to a second cycle if a visual inspection of substrate 30 with a SEM, for example, reveals the presence of some organic residues 38 that have not been removed from the low k dielectric layer 33 or from within the via 34 or trench 37. For example, a first cycle involving process A may be followed by a second cycle with a process B, or vice versa. In another embodiment, a first cycle with process A is followed by a second cycle with process A or a first cycle with process B is followed by a second cycle with process B. After a second cycle is completed, the substrate 30 may be treated with a diketone such as hexafluoroacetylacetone in a liquid or gas phase at a chamber temperature of between 20° C. and 120° C. for less than 180 seconds to remove a thin metal oxide layer that may form on the conductive layer 31. Note that a copper oxide is likely to form when the conductive layer 31 is copper.

In an alternative embodiment, a cleaning mixture is applied to substrate 30 in a process chamber that is capable of handling supercritical fluid (SCF) mixtures. Ozone with a flow rate of about 0.1 to 20 standard cubic centimeters per minute (sccm) and $CO_2$ are flowed into a process chamber that contains the substrate 30 and the pressure is increased until the $CO_2$ reaches a supercritical state. It is understood that ozone remains in non-critical state. A preferred ratio of ozone to $CO_2$ is from 1:100 to $1:1\times10^5$. The mixture may be preheated before entering the process chamber which can be modified to accommodate different sized substrates in either a single wafer mode or in a batch mode. The ozone/$CO_2$ mixture may be further comprised of a diketone to prevent the oxidation of the conductive layer 31. Typically, the supercritical fluid mixture is at a temperature between about 30° C. and 150° C. within the process chamber. The process chamber and lines containing the supercritical $CO_2$ and ozone mixture are capable of withstanding process pressures of between 70 and 700 atmospheres. As the supercritical $O_3/CO_2$ mixture contacts the substrate 30, the organic residues 38 are removed from the low k dielectric layer 33. Although the cleaning operation is preferably performed in a static mode, a continuous flow of the SCF mixture over the substrate 30 may be employed. An end point detect method may be used to determine when all organic residues 38 are removed or the process may be performed for a predetermined fixed time period.

Optionally, the SCF treatment is comprised of two steps. In a static mode, after the first step of contacting the substrate with an $O_3/CO_2$ mixture is completed, the SCF mixture is evacuated from the process chamber. A mixture of $CO_2$ and a diketone such as hexafluoroacetylacetone is flowed into the process chamber and the pressure is increased until a supercritical $CO_2$ state is reached. The second step involves contacting the surface of the substrate 30 with the supercritical $CO_2$/diketone mixture for a period of about 5 to 50 seconds. The diketone contacts the surface of exposed portions of the conductive layer 31 and is especially effective in removing a thin metal oxide layer that typically forms on the conductive layer as a result of the first SCF step. The process chamber is again evacuated and then returned to atmospheric pressure to allow the removal of the substrate 30.

In a continuous flow SCF system, the first SCF step is terminated by stopping the flow of ozone. A second step is initiated by adding a diketone such as hexafluoroacetylacetone into the supercritical $CO_2$ stream to remove a thin metal oxide layer (not shown) that can form on the conductive layer 31 as a result of the ozone treatment. The diketone is added to the supercritical $CO_2$ at a flow rate of about 0.5 to 10 sccm for a period of about 5 to 50 seconds. Thereafter, the flow of diketone and $CO_2$ is stopped to enable the process chamber to be returned to atmospheric pressure and to allow the substrate 30 to be removed.

The use of a SCF $CO_2$/ozone mixture is especially preferred for hard to remove organic residues 38 since a supercritical fluid method typically has a higher cleaning efficiency than a liquid solution. Moreover, a significant cost savings is realized by implementing a SCF cleaning because the volume of liquid solution that is sent to waste treatment is greatly reduced. Additionally, the SCF method avoids the use of some corrosive or toxic cleaning chemicals that are not environmentally friendly.

Figure 11:
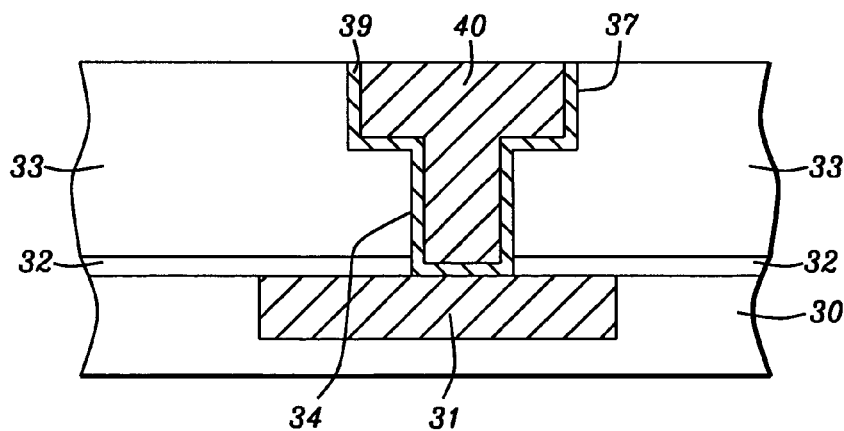

Referring to FIG. 11, the dual damascene fabrication scheme is completed by forming a conformal diffusion barrier layer 39 on the sidewalls and bottoms of trench 37 and via 34. The diffusion barrier layer 39 is comprised of one or more of Ta, TaN, Ti, TiN, for example. A copper layer 40 is deposited on the diffusion barrier layer 39 to a level above the low k dielectric layer 33 and is preferably planarized by a CMP process to give a polished copper layer 40 that is coplanar with the low k dielectric layer 33.

Those skilled in the art will recognize that other combinations of a liquid cleaning solution of the present invention with the SCF $CO_2$/ozone cleaning mixture of the second embodiment are possible. For instance, the ashing process to remove the second photoresist layer 36, plug layer 35, and etch residues in the second embodiment may be replaced by the liquid treatment involving cleaning process A or B. Thereafter, the treatment with the SCF $CO_2$/ozone cleaning mixture may be performed to strip any remaining organic residues 38 in the via 34 or trench 37. The advantages of employing the various process flows of the second embodiment are equivalent to those mentioned for the first embodiment. The milder reaction conditions of a liquid ozone treatment or SCF application with ozone compared to a conventional ashing step significantly reduces damage to an adjacent low k dielectric layer and to an underlying copper layer. As a result, a copper interconnect is formed in a device with higher performance and better reliability. The implementation of a SCF $CO_2$/ozone cleaning step is especially preferred since it can reduce the cost of the interconnect fabrication by avoiding the expensive use of solvents.

While this invention has been particularly shown and described with reference to, the preferred embodiments thereof, it will be understood by those skilled in the art that various changes in form and details may be made without departing from the spirit and scope of this invention.

We claim:

1. A fully wet method of removing an organic layer or organic residue from a substrate, comprising:
    (a) providing a substrate with a low k dielectric layer having an organic layer or organic residue formed thereon; and
    (b) contacting the low k dielectric layer on said substrate with a liquid solution that includes ozone and water, said ozone and said water together constituting at least 95% by volume of the total volume of said liquid solution;
    wherein the liquid solution further includes one or more additives that are each selected from a group consisting of $NH_4OH$, hydroxylamine, $NH_4F$, $NH_4Cl$, $NH_4Br$, and $NH_4I$; and wherein the liquid solution further includes one or more additives that are each selected from a group consisting at $H_2SO_4$, HCl, and HF.

2. The method of claim 1 wherein the amount of the additives in the liquid solution is less than about 5% by volume of the total volume of the liquid solution.

3. The method of claim 1 further including:
rinsing said substrate with DI water after said contacting;
drying said substrate; and
then contacting said substrate a second time with a liquid solution that includes ozone, water, and one or more additives which are each one of $H_2SO_4$, HCl, and HF.

4. The method of claim 1 wherein the temperature of said liquid solution is between about 5° C. to 100° C.

5. The method of claim 1 wherein said contacting the low k dielectric layer involves applying the liquid solution by a spray method or by immersion.

6. The method of claim 1 wherein said liquid solution further includes one or more chelating agents.

7. The method of claim 6 wherein each said chelating agent is one of ethylenediaminediacetic acid (EDDA) and ethylenediaminetetracetic acid (EDTA).

8. The method of claim 6 wherein the total amount of the one or more chelating agents added to the solution is less than about 1% by weight of the total liquid solution.

9. The method of claim 1 wherein said organic layer is one of a patterned photoresist layer, a plug layer, and an anti-reflective coating and said organic residue is form a previous process step.

10. A method of removing an organic layer during the formation of a copper interconnect on a substrate comprising:
(a) providing a substrate with a first copper layer having an exposed top surface and a stack comprised of an upper first photoresist layer, a middle low k dielectric layer and a lower etch stop layer formed on said substrate, said stack has a via formed therein that is aligned over said first copper layer;
(b) contacting said first photoresist layer with a liquid solution comprised of ozone, water, and one or more additives to remove the first photoresist layer from said substrate;
(c) forming a plug layer comprised of a hardened organic layer in said via and coating and patterning a second photoreist layer to form a trench above said via, said trench is transferred into said low k dielectric layer by a plasma etch process; and
(d) contacting said plug layer and said second photoresist layer with a liquid solution comprised of ozone, water and one or more additives to remove said plug layer and second photoresist from the substrate.

11. The method of claim 10 further comprised of depositing a diffusion barrier layer within said via and trench, depositing a second copper layer on said diffusion barrier layer to fill said via and trench; and planarizing said second copper layer to be coplanar with said low k dielectric layer.

12. The method of claim 10 wherein said one or more additives are selected from a first group which is $NH_4OH$, hydroxylamine, $NH_4F$, $NH_4Cl$, $NH_4Br$, and $NH_4I$.

13. The method of claim 10 wherein said one or more additives are selected from a second group which is $H_2SO_4$, HCl, and HF.

14. The method of claim 10 wherein the amount of additives in the liquid solution in steps (b) and (d) is less than about 5% by volume of the liquid solution.

15. The method of claim 10 wherein the temperature of said liquid solution is from about 5° C. to 100° C.

16. The method of claim 10 wherein said contracting comprises applying the liquid solution by a spray method or by an immersion process.

17. The method of claim 10 wherein said liquid solution is further comprised of one or more chelating agents.

18. The method of claim 17 wherein said chelating agent is EDDA or EDTA.

19. The method of claim 17 wherein the amount of one or more chelating agents added to the solution is less than about 1% by weight of the total liquid solution.

20. A method of removing organic residue from a low k dielectric layer on a substrate during the fabrication of a metal interconnect comprising:
(a) providing a substrate with a stack that includes a lower etch stop layer and an upper low k dielectric layer formed thereon, said stack having an opening formed therein in which organic residue remains from one or more previous process steps and where said opening exposes a portion of a conductive layer in said substrate; and
(b) contacting the organic residue on said substrate with a liquid solution that includes ozone and water, said ozone and said water together constituting at least 95% by volume of the total volume of said liquid solution.

21. The method of claim 20 wherein said opening is a via, a trench, or a trench formed above a via.

22. The method of claim 20 wherein said liquid solution has a temperature in the range of about 5° C. No 100° C.

23. The method of claim 20 wherein said contacting with a liquid solution is performed in a single wafer tool or in a batch process tool.

24. The method of claim 20 wherein said liquid solution further includes a chelating agent.

25. The method of claim 20 wherein the liquid solution further includes a diketone to prevent oxidation of said conductive layer.

26. The method of claim 20 further including:
rinsing said substrate with DI water after step (b);
drying said substrate; and
then contacting the conductive layer with a diketone reagent.

27. The method of claim 26 wherein the chamber temperature is between about 20° C. and 120° C. and said diketone is applied for a period of less than about 180 seconds.

28. The method of claim 26 wherein said diketone is in a liquid phase and is applied at the rate of about 0.001 to 10 ml per minute.

29. The method of claim 26 wherein said diketone is in a gas phase and is applied with a flaw rate of from 1 to 10 sccm.

30. The method of claim 10, wherein in the liquid solution of step (b), said ozone and said water together constitute at least 95% by volume of the total volume of the liquid solution.

31. The method of claim 10, wherein in the liquid solution of step (d), said ozone and said water together constitute at least 95% by volume of the total volume of the liquid solution.

* * * * *